US010236205B2

(12) United States Patent
Hu et al.

(10) Patent No.: US 10,236,205 B2
(45) Date of Patent: Mar. 19, 2019

(54) THIN FILM AND METHOD FOR MANUFACTURING THIN FILM

(71) Applicant: Jinan Jingzheng Electronics Co., Ltd., Shandong (CN)

(72) Inventors: Hui Hu, Shandong (CN); Wen Hu, Shandong (CN)

(73) Assignee: Jinan Jingzheng Electronics Co., Ltd., Shandong (CN)

( * ) Notice: Subject to any disclaimer, the term of this patent is extended or adjusted under 35 U.S.C. 154(b) by 647 days.

(21) Appl. No.: 14/781,268

(22) PCT Filed: Aug. 27, 2013

(86) PCT No.: PCT/CN2013/082347
§ 371 (c)(1),
(2) Date: Sep. 29, 2015

(87) PCT Pub. No.: WO2014/153923
PCT Pub. Date: Oct. 2, 2014

(65) Prior Publication Data
US 2016/0056068 A1    Feb. 25, 2016

(30) Foreign Application Priority Data

Mar. 29, 2013   (CN) .......................... 2013 1 0109350

(51) Int. Cl.
*H01L 21/762* (2006.01)
*H01L 29/20* (2006.01)
*H01L 29/24* (2006.01)

(52) U.S. Cl.
CPC ........ *H01L 21/76254* (2013.01); *H01L 29/20* (2013.01); *H01L 29/24* (2013.01)

(58) Field of Classification Search
CPC .................. H01L 21/76254; Y10T 428/24802
See application file for complete search history.

(56) References Cited

U.S. PATENT DOCUMENTS 6,809,044 B1 * 10/2004 Aspar ................. H01L 21/2007
257/E21.122
7,235,812 B2 * 6/2007 Chu .................. H01L 21/76254
257/347
(Continued)

FOREIGN PATENT DOCUMENTS

CN     100342486 C    10/2007
CN     100456424 C     1/2009
(Continued)

*Primary Examiner* — Gerard Higgins
(74) *Attorney, Agent, or Firm* — Blank Rome LLP

(57) ABSTRACT

The present invention provides a kind of thin film and a fabrication method of thin films. The method comprises implanting ions under the surface of the original substrate by ion-implanting method, hence creating a thin film layer, a splitting layer and a remaining material layer on the original substrate; wherein, the thin film layer is on the surface of the original substrate and the splitting layer is between the thin film layer and the remaining material layer; the implanted ions are distributed in the splitting layer. Make the target substrate be in contact with the thin film layer of the original substrate, and then bond the original substrate to the target substrate by wafer-bonding method to form a bonding unit. Place the bonding unit into a prepared container to heat the bonding unit, so that the thin film layer is split off from the remaining material layer. After the splitting of the thin film layer and the remaining material layer, continue to heat the thin film layer and the target substrate in the prepared container for scheduled time under the condition of high pressure atmosphere. The present invention can greatly reduce the defect density of thin films, and the thin films fabricated thereby are with a large size, an equal area to that of the wafer, nanoscale thickness and good uniformity of film thickness.

20 Claims, 4 Drawing Sheets

(56) References Cited

U.S. PATENT DOCUMENTS 7,550,370 B2 *  6/2009  Chen ................ H01L 21/02381
                                              438/455
2004/0180518 A1  9/2004  Chang et al.

FOREIGN PATENT DOCUMENTS

CN    101620983 A    1/2010
CN    102361061 A    2/2012

* cited by examiner

THIN FILM AND METHOD FOR MANUFACTURING THIN FILM

CROSS-REFERENCE TO RELATED APPLICATION

This application claims the benefit under 35 USC 119(a) of Chinese Patent Application No. 201310109350.7, filed on Mar. 29, 2013, in the Chinese Intellectual Property Office, the entire disclosure of which is incorporated herein by reference for all purposes.

TECHNICAL FIELD

The exemplary embodiment of the present disclosure involves thin films and the fabrication method thereof, especially a kind of thin film with uniform film thickness and low defect density, and its fabrication method.

BACKGROUND

Lithium niobate thin films and lithium tantalate thin films are widely used in optical signal processing, information storage, electronic devices, etc. For example, lithium niobate thin films and lithium tantalate thin films can become substrate materials for making opto-electronic devices and integrated optical circuits with high frequency, high bandwidth, high integration, high capacity and low power consumption.

In 1992, Bruel raised a method to peel thin films from semiconductor bulk materials, which is called smart cut, whose procedures mainly comprises technologies of ion implantation, bonding, thermal splitting and surface polishing of thin films. Specifically it starts with implantation of gas ions such as hydrogen ions or helium ions in the original substrate. The quantity distribution of the implanted ions at different depths is presented as Gaussian distribution. Most of the implanted ions stay at a certain depth under the surface of the original substrate. Said certain depths are decided by the energy of implanted ions. The area where the implanted ions concentrate and stay is called the splitting layer, whose thickness ranges from tens of to hundreds of nanometers or so. The part of the original substrate between the splitting layer and the upper surface of the original substrate is the thin film layer which is to be peeled off. The other part is the remaining material layer to be left after the peeling. The thin film layer and the remaining material layer are substantially free of implanted ions. Make the target substrate face and become in contact with the thin film layer of the original substrate, so as to carry out the direct bonding of wafers and form a bonding unit. The bonding unit is then heated. The heating makes the temperature rise over 450□ (namely, splitting temperature), making the thin film layer split from the remaining material layer. The heating is of two functions. The first function is to enable the implanted ions in the splitting layer to obtain ample energy to break away from the bondage of substrate ions so as to make break the bond formed between the implanted ions and the substrate ions, the implanted ion turning into gas atom (for example, the implanted helium ions become He), or meeting with another detached implanted ion and turning into gas molecules (for example, one implanted hydrogen ion meets with another hydrogen ion and become $H_2$). The gas atoms or molecules occupy a certain volume and sequentially some tiny cracks are formed in the splitting layer. As the heating time increases or heating temperature rises, the gas atoms or molecules accumulate and get aggregated with each other, thus giving birth to tiny bubbles in the splitting layer. Then the bubbles expand into a whole, finally making the splitting layer breaks, and sequentially separating the thin film layer which is bonded to the target substrate from the remaining material layer. The other function of heating is to strengthen the bonding force between the bonded wafers (namely, strengthen the bonding force between the original substrate and the target substrate). After the splitting of the remaining material layer from the thin film layer and the target substrate, anneal the thin film layer and the target substrate at a high temperature (generally, the temperature is above 600□; wherein, the target substrate is taken as the handle substrate of the thin film layer), so as to further strengthen the bonding force and exterminate the lattice defects formed in the thin film layer during the process of ion-implantation. Finally, polish the surface and get the thin film.

In this method, a very critical step is to split the bonding unit by heating. If this process is properly controlled, then intact thin films with few defects can be obtained. In spite of the above-mentioned method of splitting by heating, there are still some other methods to split the bonding wafers, such as high-pressure water gun splitting method, microwave method, the combination of microwave and heating methods, etc. Therefore, different methods of fabricating thin films come into being. And these methods are widely used in the fabrication of silicon on insulator (SOI).

However, when methods similar to the smart cut method are used to form thin films whose splitting temperature is low (for example, oxide crystal materials thin film such as lithium niobate thin films or lithium tantalate thin films, GaAs thin films, etc.), there will be bubbles appearing on the thin film at last, which results in a very poor quality of the finished thin film products.

SUMMARY

In order to solve the above-mentioned problems and/or the problems lying in other existing technologies, one aspect of the exemplary embodiment is to provide a fabrication method of thin films. The described method can produce thin films with low defect density. In addition, the described thin films are also characterized by good uniformity in film thicknesses, large sizes, area equal to those of the wafers, nanoscale thickness, etc.

One aspect of the exemplary embodiment is to provide a fabrication method of thin films. The method comprises: implanting ions into the original substrate by ion-implantation method, the implanted ions go through a surface of the original substrate and are mainly distributed in the splitting layer of the original substrate, which makes the formation of a thin film layer, a splitting layer and a remaining material layer in the original substrate, wherein, the thin film layer is a part of the original substrate from said surface of the original substrate to the splitting layer, the remaining material layer is a part of the original substrate except for the thin film layer and the splitting layer; making the target substrate be in contact with the thin film layer of the original substrate, and then bonding the original substrate and the target substrate together by wafer-bonding method to form a bonding unit; placing the bonding unit into a predetermined container to heat the bonding unit, making the thin film layer split from the remaining material layer; after the splitting of the thin film layer from the remaining material layer, continuing to heat the thin film layer and the target substrate for scheduled time in the predetermined container under the atmospheric condition of the atmospheric pressure being higher than about 5 bar. Preferably, the thin film layer and the target substrate can be continually heated for scheduled time under the atmospheric condition of the atmospheric pressure being above 10 bar.

More preferably, the described pressure may be 30 bar to 600 bar.

At the step of heating the bonding unit so as to make the thin film layer split from the remaining material layer, heating the bonding unit in the predetermined container under the atmospheric condition of the atmospheric pressure being kept above about 5 bar.

At the step of continuing to heat the thin film layer and the target substrate for scheduled time under the atmospheric condition of the atmospheric pressure being higher than 5 bar, infuse oxygen into the predetermined container and go on heating the thin film for scheduled time under the atmospheric condition of the atmospheric pressure being higher than about 5 bar or about 10 bar so as to make the bonding gas fully diffuse from between the thin film layer and the target substrate.

Oxygen is included in the atmosphere with the atmospheric pressure being higher than about 5 bar used in the step of heating the bonding unit to split the thin film layer from the remaining material layer.

The method further comprises: after the step of continuing to heat the thin film layer and the target substrate for scheduled time under the atmospheric condition of the atmospheric pressure being higher than 5 bar, the thin film layer can be continuously heated under the atmospheric condition of the atmospheric pressure being below 2 bar, and oxygen can be infused in the atmosphere with the atmospheric condition being below 2 bar during the heating process.

There is no oxygen or a little oxygen with the quantity meeting the safety standards in the atmosphere with the atmospheric pressure being higher than about 5 bar used at the step of heating the bonding unit to split the thin film layer from the remaining material layer.

At the step of heating the bonding unit to split the thin film layer from the remaining material layer, heat the bonding unit under the atmospheric condition of the atmospheric pressure being below 2 bar, making the thin film layer split from the remaining material layer.

At the step of continuing to heat the thin film layer and the target substrate in the predetermined container under the atmospheric condition of the atmospheric pressure being higher than about 5 bar for scheduled time, infuse gas including oxygen into the predetermined container and make the atmospheric pressure of the atmosphere in the predetermined container be higher than about 5 bar or 10 bar, heat the thin film under such atmospheric condition such that the bonding gas was fully diffuse from between thin film layer and the target substrate.

Oxygen is included in the atmosphere with an atmospheric pressure being lower than about 2 bar used in the step of heating the bonding unit to split the thin film layer from the remaining material layer.

After the step of continuing to heat the thin film layer and the target substrate for scheduled time under the atmospheric condition of the atmospheric pressure being higher than about 5 bar, continue to heat the thin film layer under the atmospheric condition of the atmospheric pressure being lower than about 2 bar and infuse oxygen during the heating process under the atmospheric condition of the atmospheric pressure being lower than about 2 bar.

Finally, perform surface-polishing process on the thin film layer and get the finished thin film.

The method of ion-implantation is selected from any one of ion-implanter implanting method, plasma immersion ion-implanting method and the ion-implanting method of sectional implanting at different temperatures.

The implanted ions in the ion-implantation method are selected from hydrogen ions, helium ions, or the mixture of the both.

The surface of the target substrate which is to be in contact with the thin film layer of the original substrate is coated with a layer of silicon dioxide.

The wafer-bonding method can be selected from any one of direct bonding method, anodic bonding method, low temperature bonding method, vacuum bonding method, plasma enhanced bonding method and adhesive bonding method.

The atmosphere in the predetermined container contains nitrogen or inert gas or the mixture of the both.

After the continuing to heat the thin film layer and the target substrate for scheduled time in the predetermined container under the atmospheric condition of the atmospheric pressure being higher than about 5 bar, make the temperature in the predetermined container reach nearly 150° C. to about 800° C.

The predetermined container is an autoclave. When the thin film to be fabricated is lithium niobate thin film, implant helium ions with about 230 keV energy into the original substrate at a dose of about $4 \times 10^{16}$ ions/cm$^2$, the target substrate is a lithium niobate wafer; Cover a layer of silicon dioxide of about 1.3 μm in thickness on the surface of the target substrate to be in contact with the thin film layer of the original substrate. Place the bonding unit into the autoclave. After the splitting of the thin film layer from the remaining material layer, keep the pressure in the atmosphere at about 200 bar, and increase the temperature to about 350□, and keep this for about 10 hours at least.

The reduction of pressure is realized by taking the thin film layer and the target substrate out of the predetermined container and putting them into another container in which the atmospheric pressure is lower than that in the prepared container, or by exhausting the gas in the predetermined container without taking out the thin film layer.

According to the other aspect of the exemplary embodiment, it provides a method of fabricating thin films; wherein, implant ions against the surface of the original substrate by ion-implantation method, forming a thin film layer, a splitting layer and a remaining material layer in the original substrate. The thin film layer is on the surface of the original substrate; the splitting layer is between the thin film layer and the remaining material layer and the implanted ions are distributed at the splitting layer. Bond the original substrate to the target substrate by using the wafer-bonding method, forming a bonding unit; wherein the target substrate is in contact with the thin film layer. Place the bonding unit into the first container and heat it under normal atmospheric pressure so as to make the thin film layer split from the remaining material layer; On the condition that no bubbles have been formed on the surface of the thin film layer after splitting, lower the temperature in the first container rapidly; then take out the thin film layer and the target substrate and put them into the second container. Heat them for scheduled time under the atmospheric condition where the atmospheric pressure is above 5 bar. Then infuse oxygen under normal atmospheric pressure and heat them; polish the surface of the thin film.

According to another aspect of the exemplary embodiment, it provides a method of fabricating thin films; wherein, implant ions against the surface of the original substrate by ion-implantation method, forming a thin film layer, a splitting layer and a remaining material layer in the original substrate. The thin film layer is on the surface of the original substrate; the splitting layer is between the thin film layer and the remaining material layer and the implanted ions are distributed at the splitting layer. Bond the original substrate to the target substrate by using wafer-bonding method, forming a bonding unit; wherein the target substrate is in contact with the thin film layer. Place the bonding unit into a prepared container and heat the bonding unit, making the thin film layer split from the remaining material layer; after the splitting of the thin film layer from the remaining material layer, keep heating the thin film layer and the target substrate in the prepared container for scheduled time with the surrounding of the gas whose atmospheric pressure is above 10 bar, so as to make the bonding gas fully diffuse from between the thin film layer and the target substrate.

According to the other hand of the exemplary embodiment, it provides a kind of thin film, wherein, the splitting temperature of the thin film is below 400□. Meanwhile, the thickness of the thin film ranges from 20 nm to 1500 nm. The uniformity of film thickness is 5% and the defect density is below 1 per square centimeter.

The thin film is lithium niobate thin film, lithium tantalate thin film, or gallium arsenide thin film.

According to the other hand of the exemplary embodiment, it provides a fabrication method of a kind of thin film. The method comprises the following steps: provide a kind of original substrate; form a splitting layer where ions are aggregated in the described original substrate by using ion-implanting method; by the described splitting layer, make the original substrate form: a layer of thin film, which is the area of the original substrate that bears ion-implantation; and a layer of remaining material, which is the area of the original substrate that is free of ion-implantation. Bond the target substrate to the original substrate by wafer-bonding method, making the target substrate and the original substrate form a bonding unit; and heat the bonding unit under the condition of high-pressure gas (the high pressure ranging from 30 bar to 600 bar), making the bonding unit split, forming a thin film. Or heat and split the bonding unit under normal atmospheric pressure (1 bar); in a comparatively short period after splitting and when bubbles have not appeared on the surface, heat the formed thin film under the condition of being surrounded by high-pressure gas. Further heat the thin film to enhance the bonding force and eliminate the lattice defects formed in the thin film due to ion-implantation; the heating process can be carried out under normal atmospheric pressure or high pressure. Polish the surface of the obtained thin film.

The core of the exemplary embodiment lies in: heat the bonding unit with the surrounding of high-pressure gas to make it split; after splitting, with the surrounding of high-pressure gas, continue the heating for a certain period of time (5 mins to 100 hours); or heat and split the bonding unit under normal atmospheric pressure; in a comparatively short period after splitting and when bubbles have not appeared on the surface, heat the formed thin film for certain time (5 mins to 100 hours) under the condition of being surrounded by high-pressure gas.

With the effect of high-pressure gas, the surface of the thin film are subjected to pressure pointing towards the target substrate. The bonding gas finds no way to expand; therefore, the formation of bubbles can be avoided. This further make the bubbles on the surface of the thin film shrink in area and decrease in quantity, improving the qualified rate of products.

The method in the exemplary embodiment is to heat the bonding unit or the thin film by using the surrounding of high-pressure gas, which is different from the method of heating under normal atmospheric pressure. In the heating in atmospheric gases, the atmospheric gases mainly provides protecting atmosphere, so as to prevent the bonding unit or the thin film from oxidation or other chemical reactions. In the heating in high-pressure gases, the high-pressure gas imposes the surface of the thin film a force pointing against the target substrate. When the force is strong enough and strikes a balance with the force generated by the bonding gas, the bonding gas finds no way to expand; consequently, the appearance of bubbles is avoided. As the heating time increases, the gas arising at the bonding interface will diffuse out of the thin film or into the target substrate. Take out the thin film after the temperature drops to normal temperature. Since there is not enough gas to expand, when the thin film is heated again, there will be no bubble appearing on the surface of the thin film. The high-pressure gas prevents the bonding gas from expanding by the intensity of pressure it generates, which belongs to physical effect.

According to the exemplary embodiment, the defect density of thin films can be greatly reduced, and thin films with a large size, an area approximately equal to that of the wafer, nanoscale thickness and good uniformity in film thickness can be fabricated.

BRIEF DESCRIPTION OF THE DRAWINGS

Through the following detailed description to the embodiment of the invention with reference to the attached figures, the above-mentioned and other purposes and features will become more apparent; wherein.

DETAILED DESCRIPTION

Figure 1:
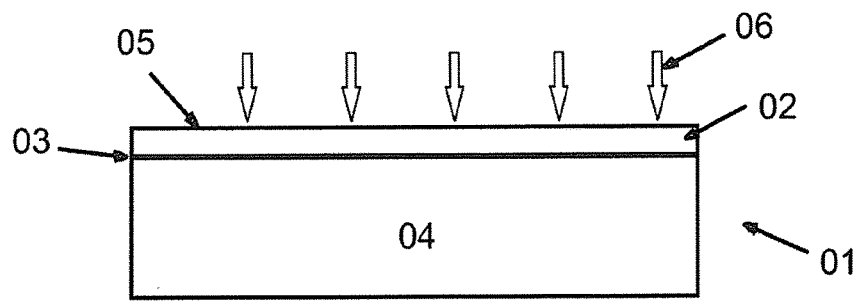
FIG. 1 is a diagram schematically showing that ions are implanted against the surface of the original substrate by ion-implantation method to create a thin film layer, a splitting layer and a remaining material layer.

Hereinafter, the embodiments of the invention will be described detailedly with reference to the accompanying drawings.

In the prior art, for lithium niobate thin films, lithium tantalate thin films and GaAs thin films formed by the smart-cut method, bubbles will appear in the thin films. The present invention probes into such phenomenon and finds out the corresponding essential reason.

The direct bonding of wafers is to polish the opposite surfaces of two wafers (the original substrate and the target substrate) to ultra smooth level (such as the surface roughness being less than 1 nm). Wash the two surfaces carefully, put them close to each other and make them join together. If the surfaces are hydrophilic, the hydroxyls (—OH) that are naturally attached to the surfaces of the wafers will attract each other by means of van der Waals forces and directly stick together. The two wafers then form a bonding unit. Later when the bonding unit of lithium niobate, lithium tantalate or GaAs is being heated, there will be bonding gas generated between the surfaces of the two wafers (the original substrate and the target substrate) that are directly bonded. Generally, it is considered to be water vapor (or there may also be hydrogen or oxygen). For example, two hydroxyls (—OH), which are bonded together by means of van der Waals forces, will turn into an oxygen bond (—O—) and a water molecule ($H_2O$) under the influence of heating. The strong attraction of oxygen bond (—O—) is for combining two wafers; while the water molecules evaporate at high temperature, turning into bonding gas.

The bonding gas, on the one hand, will diffuse into the target substrate, and diffuse into the original substrate through the thin film. The degree of diffusion is measured by diffusion coefficient. The higher the temperature is, the larger the diffusion coefficient will be. On the other hand, as the heating temperature or the heating time increases, the amount of bonding gas grows (although the amount of bonding gas grows, the part of bonding gas between the thin film layer and the target substrate will stop increasing under the effect of diffusion after the high temperature gets to a certain degree). The growing of bonding gas in amount and the rising of temperature both lead to an increasing intensity of pressure and an expanding volume of bonding gas between the thin film layer and the target substrate.

Before the bonding unit splits, as the original substrate and the target substrate are both relatively thick (both of them are around 500 μm in thickness), and the materials are with large stiffness, the bonded wafers are not liable to become out of shape; the bonding gas is confined inside the bonding unit and has certain pressure. After the bonding unit splits, the original substrate falls off, and the thin film stays on the target substrate. The bonding gas will make the thin film suffer a pressure along the direction which is away from the target substrate. When the intensity of pressure is strong enough, for example, when it is larger than the bonding force between the thin film and the target substrate, the intensity of pressure of the bonding gas will force the thin film to leave the substrate, generating a crack. As the heating temperature or the heating time increases, the bonding gas will keep diffusing to the crack, gathering at the crack and forming bubbles between the target substrate and the thin film and causing defects. When the thin film is being heated, there will also be similar situation of gas accumulation, forming bubbles on the thin film and causing defects.

When the procedures of ion implantation and bonding are used to fabricate thin films with a relatively low splitting temperature, such as lithium niobate thin films, lithium tantalate thin films and GaAs thin films, it is significantly different from the procedure of fabricating silicon on insulator (SOI). Due to the difference in material property between the implanted ions and the original substrate, when SOI is being fabricated, the splitting temperature of the bonding unit is relatively high, which is usually above 450° C. (about 600° C.). Since the diffusion coefficient of gas molecules in solid sharply increases with the rise of temperature (e.g., exponential relationship), the molecules of the bonding gas can diffuse relatively easily into the silicon dioxide layer. After the bonding unit splits, most of the bonding gas has diffused out. Due to a lack of bonding gas and that the bonding force on the bonding interface is relatively strong at such temperature, bubbles will not be easily brought forth.

However, the splitting temperature is only about 150° C.-300° C. (generally, it is 200° C.) for single-crystal lithium niobate thin films or single-crystal lithium tantalate thin films. At such temperature, the bonding unit can be easily split to form a thin film. Whereas, as the splitting temperature is comparatively low and the diffusion coefficient of the bonding gas is smaller at such splitting temperature, it is not easy for the bonding gas to diffuse into the silicon dioxide layer or the lithium niobate/lithium tantalate. There is still a lot of bonding gas left at the bonding interface between the target substrate and the thin film. The thin film is very flimsy (about 1 micrometer) and is liable to be deformed. At the intensity of pressure of this portion of bonding gas, coupled with the weak bonding force at low temperature, the intensity of pressure of the bonding gas will swell the thin film, forming bubbles. These bubbles will break in later processes of annealing and polishing, defects being formed in the thin film, making the thin film incomplete. In the polishing process, the fragments of the thin film that crack and drop off may scratch the surface of the thin film, severely reducing the qualified rate of products. Similar phenomenon also occurs to GaAs thin films. Such bubble defects of thin films severely impede the industrial production of thin films which can split at comparatively low temperature, such as lithium niobate thin film, lithium tantalate thin film, GaAs thin film, etc.

Referring to FIG. 1 to FIG. 5, which presents a flow chart demonstrating the method of thin film fabrication in this invention.

FIG. 1 shows the step of implanting ions (it is possible to be molecular ions) against the surface of the original substrate by ion-implantation method to form a thin film layer, a splitting layer and a remaining material layer.

As is shown in FIG. 1, ions 06 (it is possible to be molecular ions) are implanted against the front surface 05 of the original substrate 01 by use of ion-implantation method. The area where implanted ions intensively stay become a splitting layer 03. The splitting layer separates the original substrate 01 into upper and lower parts: one is the area that most implanted ions 06 have passed through, which is the thin film layer 02; the other is the area that most implanted ions 06 haven't passed through or reached, which is called the remaining material layer 04. The thickness of the thin film layer 02 is determined by the energy of ion implantation; wherein, the ion implantation methods comprise conventional ion-implanter implanting method, plasma immersion ion-implanting method and staged implanting ion-implanting method at different implanting temperatures. The implanted ions in the ion-implantation method can be selected from, e.g. hydrogen ions or helium ions, or hydrogen ions and helium ions may be co-implanted.

The purpose of carrying out such ion-implantation method is to implant a large amount of ions 06 (it is possible to be molecular ions) into the surface layer of the original substrate 01. The implanted ions 06 in the splitting layer are in an unstable state inside the original substrate 01. The implanted ions are embed into the gap between crystal lattices, generating volumetric strain, which leads to that the splitting layer becomes a stress concentrated area. And the cohesion between crystal lattices in the splitting layer is relatively low, which leads to a weak mechanical strength at places in the original substrate 01 near the splitting layer 03.

Figure 2:
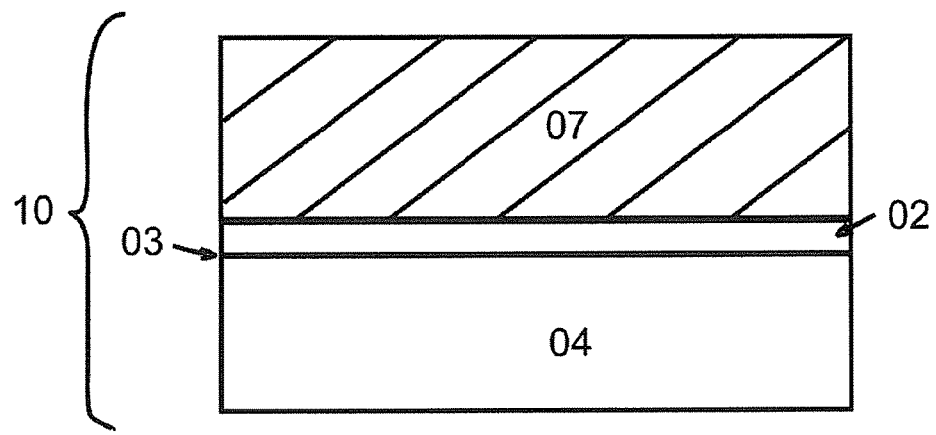
FIG. 2 is a cutaway view schematically showing that the original substrate is bonded to the target substrate to form a bonding unit.

FIG. 2 shows the step of creating a bonding unit by bonding the original substrate 01 to the target substrate 07. Then, as is shown in FIG. 2, the original substrate 01 is bonded to the target substrate 07 by wafer-bonding method, forming a bonding unit 10. Wherein, the surface of the target substrate 07 is coated with a layer of medium (such as SiO$_2$). Combine this medium layer with the thin film layer 02 of the original substrate 01 face to face and then bond them.

In this process, the wafer bonding method can be selected from any one of direct bonding method, anodic bonding method, low temperature bonding method, vacuum bonding method, plasma enhanced bonding method and adhesive bonding method. Take direct bonding method for example, when two wafers which are hydrophilic get close to each other, the hydroxyls (—OH) that are naturally attached to the surfaces will attract each other by means of van der Waals forces, forming a bonding unit 10.

Figure 3:
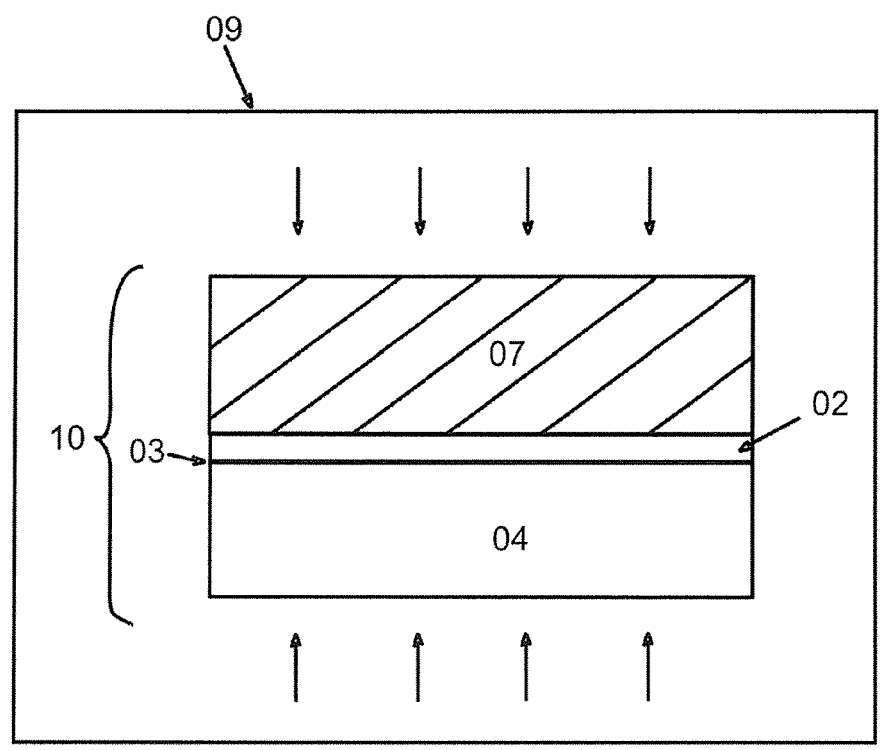
FIG. 3 is a cutaway view schematically showing that the bonding unit is heated in the high-pressure apparatus, under the atmospheric condition of high pressure gas.

FIG. 3 shows the step that in the high-pressure container 09, heat the bonding unit which is surrounded by high-pressure gas. As is shown in FIG. 3, place the bonding unit 10 into a high-pressure container 09 and infuse high-pressure gas like nitrogen, helium, etc. (oxygen may also be contained, but may be relatively dangerous). The intensity of pressure can be set at around 30 bar to 600 bar and then raise the temperature to 150□-800□. In the heating process, the implanted ions turn into gas molecules or atoms, forming a lot of tiny bubbles. As the heating time or heating temperature increases, bubbles will accumulate and their volume will grow bigger and bigger. Finally, the bubbles are connected to each other, making the thin film layer and the remaining material layer separate from each other.

Meanwhile, there is bonding gas emerging from the bonding interface between the thin film layer 02 and the target substrate 07. As the heating temperature or heating time increases, bonding gas gradually accumulate and the intensity of pressure grows bigger and bigger. Before the bonding unit splits, as the bonded wafer is relatively thick with large material stiffness, it is not liable to become out of shape. And under the effect of the pressure given out by the high-pressure gas, the bonding gas is confined between the original substrate and the target substrate, hard to expand. Bubbles will not be easily formed.

In another embodiment, at the above step of heating the bonded wafers to make them split, the bonding unit 10 can also be put into a container 09 with normal atmospheric pressure, instead of being heated under high pressure. It will be concretely elucidated later.

Figure 4:
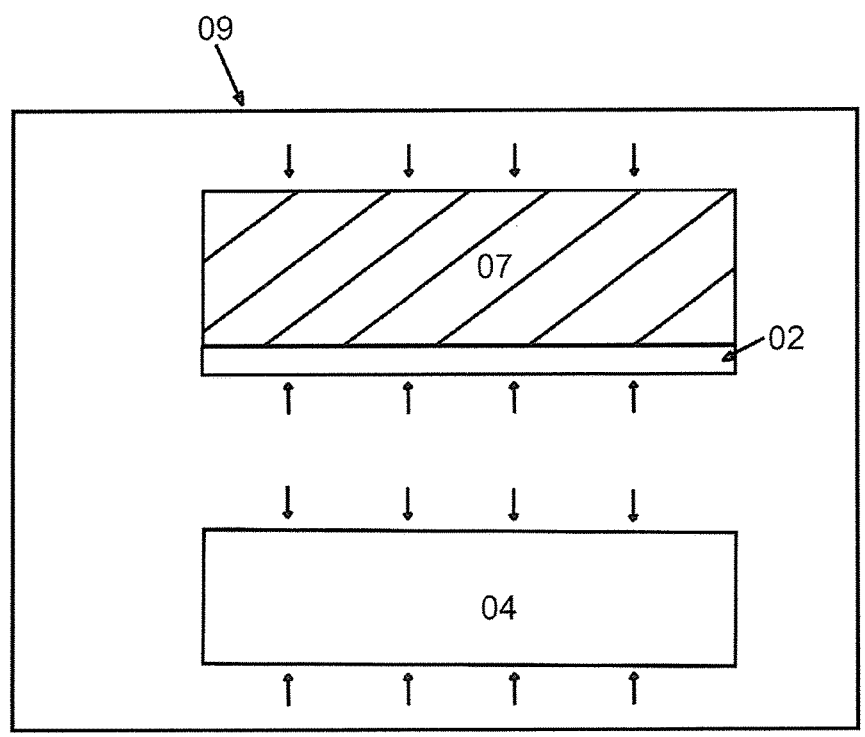
FIG. 4 is a cutaway view schematically showing that the thin film layer is transferred onto the target substrate and the thin film is heated under the atmospheric condition of high pressure gas.

FIG. 4 shows the step that the thin film layer 02 is transferred onto the target substrate 07 and that the thin film is heated with the surrounding of high-pressure gas. As is shown in FIG. 4, when the thin film layer 02 and the target substrate 07 are separated from the remaining material layer, the thin film layer is transferred onto the target substrate 07, with the bonding gas being confined between the target substrate 07 and the thin film 02.

In an embodiment, when bonded wafers separate, keep heating the bonded wafers under high pressure (at least above 5 bar, preferably above 10 bar, and 30 bar-600 bar the best) for predetermined time. The bonding gas is confined between the target substrate 07 and the thin film 02 at this moment and still suffer the effect of the intensity of pressure from high-pressure gas. The direction of the pressure is vertical to the surface of the thin film and points at the target substrate. If the intensity of pressure of the high-pressure gas is strong enough, and is bigger than or equivalent to that of the bonding gas when combined with the bonding force, the bonding gas still cannot expand so that the thin film will not be raised and bubbles will not be formed. As the heating time or heating temperature increases, the bonding gas diffuses out through the thin film or into the target substrate. After predetermined time, cool the wafer, release high-pressure gas and take the wafer out. Then heat the wafer under normal atmospheric pressure. At this moment, no bubble will be formed. It is because the bonding gas has already been fully diffused out previously and the amount of bonding gas remaining at the bonding interface decreases, consequently, there is not enough amount of bonding gas to form bubbles. There are mainly two purposes for heating under normal atmospheric pressure. One is to keep improving the bonding force. The other is to use the oxygen atmosphere safely under normal atmospheric pressure, which may compensate the lost oxygen (e.g, the oxygen lost because the thin film is precipitated in the form of Li$_2$O at a high temperature) in ion-implantation or heating processes of lithium niobate thin films, lithium tantalate thin films, etc. Thus, the heating can be: heat and split the bonding unit in high pressure atmosphere and then continue to heat the formed thin film; then take it out and heat it under normal atmospheric pressure in infused oxygen.

In another embodiment, after heating and splitting the bonded wafers in high pressure atmosphere, the thin film can be continuously heated in high pressure atmosphere without being taken out. In addition, infuse oxygen during the heating process till the bonding gas is fully diffused out. The advantage of using oxygen is to compensate the lost oxygen (e.g, the oxygen lost because the thin film is precipitated in the form of Li$_2$O at a high temperature) in the ion-implantation or heating processes of lithium niobate thin films, lithium tantalate thin films, etc. The fabricated thin films may not need later heating processes under normal atmospheric pressure, which shortens technological steps. However, it should be noted that oxygen becomes very dangerous at high temperatures under high pressure. Therefore, the method of mixing oxygen and inert gas may be adopted.

The high-pressure gas, which is used in the process of heating the bonded wafers to make them separate as well as the process of continuously heating the split thin film under high pressure, is usually selected from oxygen, nitrogen, or inert gas like argon, etc., or the mixed gas including them (e.g, the gas mixture of oxygen and any inert gas).

Heat the thin film which is surrounded by high pressure gas. The gas diffusion mainly comprises three parts. The first part is the diffusion of bonding gas into the target substrate. The bonding gas is generally considered as water (H$_2$O) vapor (probably there are also hydrogen and/or oxygen). The target substrate is lithium niobate or lithium tantalate wafer which is coated with a medium layer of silicon dioxide. The silicon dioxide is generally made by the method of plasma enhanced deposition. Compared with single-crystal lithium niobate or single crystal lithium tantalate materials, the silicon dioxide made by deposition has relatively loose lattice structures. Water possesses a relatively high diffusion coefficient in silicon dioxide, which enables it to diffuse into silicon dioxide comparatively easily. The second part is that the bonding gas diffuses towards the thin film and finally diffuse into the high-pressure container through the thin film. As water also has comparatively high diffusion coefficients in lithium niobate crystal materials or lithium tantalate crystal materials, and it is reported in literature that the diffusion of water molecules in lithium niobate should not be neglected even at 150° C. Therefore, water is liable to diffuse through lithium niobate or lithium tantalate thin film layers. The third part is the high-pressure gas in the high-pressure container 09 penetrating the thin film and diffusing into the target substrate. Gases like nitrogen, argon, oxygen, or the gas mixture of them is usually adopted as the high-pressure gases. By now, there have been little literature reporting the diffusion coefficients of gases like nitrogen, argon, etc. in lithium niobate or lithium tantalate. However, when titanium metal is diffused into lithium niobate, it needs a high temperature over 1000° C.; and at this time, nitrogen and argon are usually used as protecting gas. Thus, the diffusion of nitrogen or argon in lithium niobate can be ignored. If oxygen is adopted as high-pressure gas, its diffusion coefficient in lithium niobate, even at a temperature as high as 710° C., is only $1.45 \times 10^{-20}$ m$^2$/s, which is still very small. In summary, it can be learned that when the bonding unit or the thin film is being heated with the surrounding of high-pressure gas, the main physical process is that the bonding gas diffuses out of the bonding interface, rather than that the high-pressure gas diffuses towards the bonding interface. Exterior high-pressure gas can hardly enter between the thin film and the target substrate. Thus, high-pressure gas will exert no negative influence over the thin film.

Figure 5:
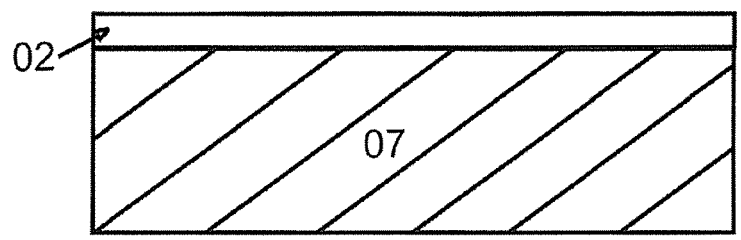
FIG. 5 is a cutaway view schematically showing the finished thin film after its surface is polished.

FIG. 5 shows the thin film after its surface was polished. As it is shown in FIG. 5, polish the surface of the thin film and get the finished thin film.

The content above makes a general introduction to the method of fabricating thin films based on the embodiment of this invention. Actually, the invention may comprise the following five methods of fabricating oxide crystal thin films such as lithium niobate thin films, lithium tantalate thin films, etc.

1. Implant ions into the original substrate to create a splitting layer. Then bond the original substrate and the target substrate to form a bonding unit by using wafer-bonding method. Then heat the bonding unit with the surrounding of high-pressure gas (oxygen may be contained), making it split to get the thin film. Oxygen may be further infused. Continue to heat the thin film surrounded by high-pressure gas for scheduled time so as to make the bonding gas fully diffuse. Afterwards, polish the surface of the thin film to get the finished thin film.

2. Implant ions into the original substrate to create a splitting layer. Then bond the original substrate and the target substrate to form a bonding unit by using wafer-bonding method. Then heat the bonding unit surrounded by high-pressure gas that does not contain oxygen (or may contain traces of oxygen whose quantity meets the safety standards), making it split to get the thin film. Continue the heating in high-pressure gas for scheduled time so as to make the bonding gas fully diffuse. Then heat the thin film under normal atmospheric pressure (decrease the pressure in the high-pressure container or take the thin film out and place it into another container with normal atmospheric pressure) with oxygen infused; afterwards, polish the surface of the thin film to get the finished thin film.

3. Implant ions into the original substrate to create a splitting layer. Then bond the original substrate and the target substrate to form a bonding unit by using wafer-bonding method. Heat and split the bonding unit under normal atmospheric pressure. In a comparatively short period after splitting and when bubbles have not appeared on the surface, infuse high-pressure gas (without oxygen or with traces of oxygen whose quantity meets the safety standards) into the container in which the bonding unit is position. Heat the thin film with the surrounding of high-pressure gas for scheduled time to make the bonding gas fully diffuse. Then heating may be conducted under normal atmospheric pressure (decrease the pressure in the container with the bonding unit or take the thin film out and place it into another container with normal atmospheric pressure) with oxygen infused; afterwards, polish the surface of the thin film.

4. Implant ions into the original substrate to create a splitting layer. Then bond the original substrate and the target substrate to form a bonding unit by using wafer-bonding method. Heat and split the bonding unit under normal atmospheric pressure. In a comparatively short period after splitting and when bubbles have not appeared on the surface, infuse high-pressure gas that contains oxygen into the annealing furnace where the bonding unit is placed. Heat the thin film with the surrounding of high-pressure gas for scheduled time so as to make the bonding gas fully diffuse; afterwards, polish the surface of the thin film.

5. Implant ions into the original substrate to create a splitting layer. Then bond the original substrate and the target substrate to form a bonding unit by using wafer-bonding method. Heat and split the bonding unit in the annealing furnace under normal atmospheric pressure. In a comparatively short period after splitting and when bubbles have not appeared on the surface, rapidly reduce the temperature in the annealing furnace where the bonding unit is placed. In this way, the bonding unit will not expand in volume and the phenomenon of bubbles does not appear. After taking the thin film out, place it into the high-pressure container. Heat it with the surrounding of high-pressure gas for a period of time. Then it may be heated under normal atmospheric pressure with oxygen infused; afterwards, polish the surface of the thin film.

The above five methods of fabricating thin films are mainly for oxide crystal thin film materials. Whereas, as for non-oxide crystal thin film materials such as GaAs, it is not necessary to infuse oxygen during the fabricating processes because there is no need to compensate the lost oxygen.

Hereinafter, takes the fabrication of lithium niobate thin films and GaAs thin films as an example, illustrating with detailed parameters the process of heating and fabricating thin films in the atmosphere of high pressure gas of the present invention and application.

Embodiment 1

The original substrate is the lithium niobate wafer which experiences the implantation of helium ions ($He^{1+}$ and/or $He^{2+}$) whose energy is 230 keV at a dose of $4 \times 10^{16}$ ions/cm$^2$. The target substrate is the lithium niobate wafer with a silicon dioxide layer of 1.3 micrometers in thickness covered on the surface. The two wafers become a bonding unit at room temperature by direct-bonding method. Place the bonding unit in the autoclave infused with nitrogen ($N_2$) with the pressure being kept at 200 bar. Later raise the temperature to 350° C. and keep it for 10 hours; then decrease the temperature to room temperature. Take the wafer out after pressure is released. The bonding unit has split up at this moment. Heat the wafer carrying the lithium niobate thin film with the surrounding of oxygen ($O_2$) atmosphere under normal atmospheric pressure at the temperature of 300☐-800☐. Then polish the surface of the thin film and get the lithium niobate thin film. The described thin film ranges from 20 nm to 1500 nm in thickness with a thickness uniformity of about 5% and a defect density of one per square centimeter.

Embodiment 2

The original substrate is the lithium niobate wafer which experiences the implantation of helium ions ($He^{1+}$ and/or $He^{2+}$) whose energy is 230 keV at a dose of $4 \times 10^{16}$ ions/cm$^2$. The target substrate is the lithium niobate wafer with a silicon dioxide layer of 1.3 micrometers in thickness covered on the surface. The two wafers are bonded at room temperature to become a bonding unit by direct-bonding method. Place the bonding unit into the oven and raise the temperature to 200□. Stop the heating instantly after the bonding unit splits. Take out the wafer carrying the lithium niobate thin film and place it into the autoclave with nitrogen infused and with the pressure kept at 200 bar. Afterwards, raise the temperature to 350° C. and keep it for 10 hours, and then decrease the temperature to room temperature. Take the wafer out after pressure is released. Heat the wafer carrying the lithium niobate thin film with the surrounding of oxygen atmosphere under normal atmospheric pressure at the temperature of 300□-800□. Then polish the surface of the thin film and get the lithium niobate thin film. The described thin film ranges from 20 nm to 1500 nm in thickness with a thickness uniformity of about 5% and a defect density of one per square centimeter.

Embodiment 3

The original substrate is the lithium niobate wafer which experiences the implantation of helium ions ($He^{1+}$ and/or $He^{2+}$) whose energy is 230 keV at a dose of $4 \times 10^{16}$ ions/cm$^2$. The target substrate is the lithium niobate wafer with a silicon dioxide layer of 1.3 micrometers in thickness covered on the surface. The two wafers become a bonding unit at room temperature by direct-bonding method. Place the bonding unit into the autoclave infused with oxygen ($O_2$) with the pressure being kept at 200 bar. Later raise the temperature to 400° C. and keep it for 10 hours; then decrease the temperature to room temperature. Take the wafer out after Pressure is released. The bonding unit has split up at this moment. Then polish the surface of the thin film and get the lithium niobate thin film. The described thin film ranges from 20 nm to 1500 nm in thickness with a thickness uniformity of about 5% and a defect density of one per square centimeter.

Embodiment 4

The original substrate is the GaAs wafer which experiences the implantation of helium ions ($He^{1+}$ and/or $He^{2+}$) whose energy is 230 keV at a dose of $4 \times 10^{16}$ ions/cm$^2$. The target substrate is aluminium oxide (sapphire). The two wafers become a bonding unit at room temperature by direct-bonding method. Place the bonding unit in the autoclave infused with nitrogen ($N_2$) with the pressure being kept at 200 bar. Later raise the temperature to 350° C. and keep it for 10 hours; then decrease the temperature to room temperature. Take the wafer out after pressure is released. The bonding unit has split up at this moment. Heat the wafer carrying the GaAs thin film with the surrounding of nitrogen ($N_2$) atmosphere under normal atmospheric pressure at the temperature of 300□-800□. Then polish the surface of the thin film and get the GaAs thin film. The described thin film ranges from 20 nm to 3500 nm in thickness with a thickness uniformity of about 5% and a defect density of one per square centimeter.

It can be drawn from above that in the present invention disclose a method. When the bonding unit or the thin film is being heated, raise the air pressure of the surrounding atmosphere to between 30 bar to 600 bar. After the bonding unit splits, under the effect of the air pressure of the ambient atmosphere, the thin film is subject to an effect of a pressure whose direction is perpendicular to and points at the target substrate. The pressure offsets the pressure generated by the bonding gas so that the thin film cannot leave the substrate and bubbles cannot be formed. Consequently, product defects are reduced and product quality get improved. The thickness of the thin film fabricated by the methods in the present invention may range from 20 nm to 3500 nm (besides GaAs, lithium niobate wafers can be fabricated to be 3500 nm in thickness as well) with a thickness uniformity of about 5% and a defect density lower than one per square centimeter.

According to the exemplary embodiment, when the bonding unit or the thin film is being heated, the pressure of the ambient atmosphere may be increased to a certain degree, so as to change the micro-physical processes during the splitting of the bonding unit and the heating of the thin film, and to reach the goal of reducing product defects, simplifying production processes and decreasing equipment investment.

For enhancing the bonding force, the method of plasma surface processing is among the usually adopted methods of the prior art. Process by plasma the surfaces of wafers which needs bonding (i.e, bombard by plasma the surfaces that need bonding to enhance the bonding force), and then proceed direct-bonding. Compared with the method of plasma surface processing, the present invention has the following advantages:

1. The thin film is with less defects and better product quality. In the process of preparing the target substrate, it is inevitable to encounter defects. For example, the target substrate that the lithium niobate thin film needs is a lithium niobate substrate covered with silicon dioxide. Silicon dioxide is typically prepared by the method of chemical vapor deposition on a lithium niobate substrate. During the fabrication processes, there will always be some impurity particles falling on the surface of the substrate. These particles will easily fall off in later processes of polishing or washing, leaving pits or scratches in the silicon dioxide layer, which causes surface defects of wafers. Even if these particles do not drop off, they may still cause localized irregularities on wafer surfaces. If the method of plasma surface processing is used, where the two wafers make no contact at the surface defects while being bonded, the bonding force is almost zero. Due to the incomplete contact of the two wafer surfaces at the particles, the bonding force is weak. If they are heated under normal atmospheric pressure, the bonding gas will be aggregated towards surface defects and particles, generating relatively high atmospheric pressure. Consequently, the thin film is liable to bulge bubbles or crack after splitting, bringing about thin film defects. However, by using the methods of the present invention, by heating the split bonding unit in the atmosphere of high-pressure gas, the pressure of the high-pressure gas will balance that of the bonding gas at the defects or particles on wafer surfaces. Therefore, the split thin film is not liable to bulge bubbles or crack. Consequently, the defects in thin films can be greatly reduced and product quality can be improved.

2. Simplify production processes and improve the qualified rate of products. When wafers are directly bonded, their surfaces are required to be extremely clean, because any speck of dust will cause defects in the thin film. When using the method of plasma for processing, before placing the wafer in the plasma processor for treatment, a wafer-washing step still need be added, in order to remove the dust that falls on the wafer surfaces during wafer transferring or processing by the plasma method. The present invention removes this extra washing step, and avoids the dust falling off during processing by the plasma method as well as defects caused by incomplete washing. It simplifies production processes and improves the qualified rate of products.

3. Lessen the investment in equipment and reduce product costs. The using of the method of plasma processing requires a comparatively expensive plasma processor, which usually comprises high frequency power supply, vacuum pumps, control systems, etc. By adopting the present invention, an autoclave may be chose as the equipment and the investment takes up only about 5% of that for a plasma processor. It lessens the investment in equipment and reduces product costs.

Although the exemplary embodiment in the present invention gives a specific description by taking lithium niobate, lithium tantalate and GaAs for example, the invention is not limited thereto. The method of fabricating thin films provided in present invention is particularly advantageous to the fabricating processes of thin films whose splitting temperature is low (e.g, oxide crystal thin film materials such as lithium niobate thin films or lithium tantalate thin films, or GaAs thin films). It can prevent bubbles from appearing on such thin films and improve the quality of the final thin films. Of course, as to thin films that has high splitting temperature, the methods of fabricating thin films according to the embodiment of the present invention can also be used.

For the purposes of promoting the understanding of the principles in the present invention, explanation has been given to the preferred embodiment shown in the figures. In addition, the embodiment has been expounded with specific diction. However, the specific diction doesn't aim to limit the scope of the present invention. The invention should be explained as including all kinds of embodiment that usually occurs to the ordinary skilled in this field. In addition, unless the elements are specifically described as "essential" or "crucial", no element or module is essential to the implementation of the present invention.

Although the above has described in detail the exemplary embodiment of the present invention, the ordinary person skilled in the art may make various modifications, retouching and variations to the embodiment of the invention without departing from the spirit and scope of the present invention. However, it should be understood that for the skilled in the art, these modifications, retouching and variations will still be classified into the spirit and scope of the exemplary embodiment in the present invention as is limited by the claims.

At last, unless it is indicated here or is additionally in obvious contradiction to the context, the steps of all the methods described herein can be performed in any suitable order.

The invention claimed is:

1. A fabrication method of thin films, the method comprises:
implanting ions into an original substrate by ion-implantation method, the implanted ions go through a surface of the original substrate and are distributed in a splitting layer of the original substrate, which forms a thin film layer, a splitting layer and a remaining material layer in the original substrate, wherein, the thin film layer is a part of the original substrate from said surface of the original substrate to the splitting layer, the remaining material layer is a part of the original substrate except for the thin film layer and the splitting layer;
contacting a surface of a target substrate with the thin film layer of the original substrate, and then bonding the original substrate and the target substrate together by wafer-bonding method to form a bonding unit, wherein the surface of the target substrate that was contacted with the thin film layer of the original substrate is coated with a layer of silicon dioxide;
placing the bonding unit into a container and heating the bonding unit so as to split the thin film layer from the remaining material layer;
after the splitting of the thin film layer from the remaining material layer, continuing to heat the thin film layer and the target substrate for scheduled time in the container under a pressure of higher than 5 bar.

2. The method of claim 1, wherein the pressure is higher than or equal to about 10 bar.

3. The method of claim 2, wherein the pressure is between about 30 bar and about 600 bar.

4. The method of claim 1, wherein the heating of the bonding unit so as to split the thin film layer from the remaining material layer includes heating the bonding unit in the container under a pressure above 5 bar.

5. The method of claim 4, wherein the continuing to heat the thin film layer and the target substrate for the scheduled time under the pressure of higher than 5 bar includes infusing oxygen into the container and heating the thin film layer and the target substrate for the scheduled time under the pressure of higher than 5 bar so as to make a bonding gas fully diffuse from between the thin film layer and the target substrate.

6. The method of claim 5, further comprising including oxygen in the container under the pressure above 5 bar during the heating of the bonding unit so as to split the thin film layer from the remaining material layer.

7. The method of claim 4, wherein the method further comprises: after the continuing to heat the thin film layer and the target substrate for the scheduled time under the pressure of higher than 5 bar, keep heating the thin film layer and the target substrate under a pressure of lower than 2 bar and infusing oxygen during the heating under the pressure of lower than 2 bar.

8. The method of claim 7, wherein there is no oxygen in the container under the pressure above 5 bar during the heating of the bonding unit so as to split the thin film layer from the remaining material layer.

9. The method of claim 1, wherein the heating of the bonding unit so as to split the thin film layer from the remaining material layer includes heating the bonding unit under a pressure of lower than 2 bar so as to split the thin film layer from the remaining material layer.

10. The method of claim 9, wherein the continuing to heat the thin film layer and the target substrate for the scheduled time under the pressure of higher than 5 bar includes infusing gas including oxygen into the container and heating the thin film layer and the target substrate for the scheduled time under the pressure of higher than 5 bar, and heating the thin film under such atmospheric condition such that a bonding gas was fully diffuse from between thin film layer and the target substrate.

11. The method of claim 10, further comprising including oxygen in the container under the pressure lower than 2 bar during the heating of the bonding unit so as to split the thin film layer from the remaining material layer.

12. The method of claim 9, wherein after the continuing to heat the thin film layer and the target substrate for the scheduled time under the pressure of higher than 5 bar, keep heating the thin film layer and the target substrate under a pressure of lower than 2 bar and infusing oxygen during the heating under the pressure of lower than 2 bar.

13. The method of claim 1, further comprising surface-polishing the thin film layer to get a finished thin film.

14. The method of claim 1, wherein the method of ion-implantation is selected from any one of ion-implanter implantation method, plasma immersion ion-implantation method and sectional-implanting ion-implantation method at different implanting temperatures.

15. The method of claim 1, wherein the implanted ions in the ion-implantation method are selected from either hydrogen ions or helium ions.

16. The method of claim 1, wherein the wafer-bonding method can be selected from any one of direct bonding method, anodic bonding method, low temperature bonding method, vacuum bonding method, plasma enhanced bonding method and adhesive bonding method.

17. The method of claim 1, wherein the atmosphere in the container contains nitrogen, an inert gas, or a mixture thereof.

18. The method of claim 1, further comprising after the continuing to heat the thin film layer and the target substrate for the scheduled time under the pressure of higher than 5 bar, making the temperature in the container be about 150° C. to about 800° C.

19. The method of claim 1, wherein the container is an autoclave, when the thin film to be fabricated is lithium niobate thin film, implant helium ions with about 230 keV energy into the original substrate at a dose of about $4 \times 10^{16}$ ions/cm$^2$, the original substrate is a lithium niobate wafer; the target substrate is a lithium niobate wafer whose surface is coated with a silicon dioxide layer, the silicon dioxide layer is to be in contact with the thin film layer of the original substrate and have a thickness of about 1.3 μm, place the bonding unit into the container, after the splitting of the thin film layer from the remaining material layer, continue to heat the thin film layer and the target substrate in the container for about 10 hours under a pressure of about 200 bar and a temperature of about 350° C.

20. The method of claim 7, wherein the reduction of the pressure to lower than 2 bar is realized by taking the thin film layer and the target substrate out of the container and putting them into another container whose pressure is lower than that of the container, or by exhausting the gas inside the container without taking out the thin film layer and the target substrate.

* * * * *